(12) United States Patent
Lee

(10) Patent No.: US 8,373,332 B2
(45) Date of Patent: Feb. 12, 2013

(54) ENERGY HARVESTING ELECTRIC DEVICE

(75) Inventor: Sang Kyun Lee, Gwangju (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 81 days.

(21) Appl. No.: 12/977,785

(22) Filed: Dec. 23, 2010

(65) Prior Publication Data

US 2012/0068576 A1  Mar. 22, 2012

(30) Foreign Application Priority Data

Sep. 16, 2010  (KR) .......................... 10-2010-0091206

(51) Int. Cl.
   *H02N 2/18*  (2006.01)
(52) U.S. Cl. .......................... 310/339; 310/318; 310/319
(58) Field of Classification Search .................. 310/339, 310/318, 319
   See application file for complete search history.

(56) References Cited

U.S. PATENT DOCUMENTS

| | | | |
|---|---|---|---|
| 7,088,031 B2 | 8/2006 | Brantner et al. | |
| 7,304,416 B2 * | 12/2007 | Mullen ......................... | 310/339 |
| 7,649,305 B2 * | 1/2010 | Priya et al. ..................... | 310/339 |
| 2005/0110277 A1 * | 5/2005 | Adamson et al. ............. | 290/1 R |
| 2006/0237968 A1 * | 10/2006 | Chandrasekaran ........... | 290/1 R |
| 2007/0125176 A1 | 6/2007 | Liu | |
| 2007/0141874 A1 * | 6/2007 | Steigerwald et al. ......... | 439/110 |
| 2008/0174273 A1 * | 7/2008 | Priya et al. .................... | 320/114 |
| 2008/0252174 A1 * | 10/2008 | Mohammadi et al. ........ | 310/319 |
| 2010/0072759 A1 * | 3/2010 | Andosca et al. .............. | 290/1 R |

FOREIGN PATENT DOCUMENTS

| KR | 10-89-003388 | 9/1989 |
|---|---|---|
| KR | 10-0387382 B1 | 5/2003 |

OTHER PUBLICATIONS

Jing-Quan Liu, et al., "A MEMS-based piezoelectric power generator array for vibration energy harvesting", Microelectronics Journal 39, 2008, pp. 802-806.

* cited by examiner

*Primary Examiner* — Walter Benson
*Assistant Examiner* — Bryan Gordon
(74) *Attorney, Agent, or Firm* — Rabin & Berdo, P.C.

(57) ABSTRACT

Provided is an energy harvesting electric device capable of increasing output power. The energy harvesting electric device includes an energy harvester array including a plurality of energy harvesters, a single rectifier connected to the energy harvester array, and an output unit which is connected to the single rectifier and has a load resistance. The energy harvesters include a plurality of first energy harvesters connected to each other in parallel and a single second energy harvester connected in parallel to the first energy harvesters. The first energy harvesters have a first specific resistance higher than the load resistance and the second energy harvester has a second specific resistance higher than the first specific resistance.

14 Claims, 6 Drawing Sheets

ENERGY HARVESTING ELECTRIC DEVICE

CROSS-REFERENCE TO RELATED APPLICATIONS

This U.S. non-provisional patent application claims priority under 35 U.S.C. §119 of Korean Patent Application No. 10-2010-0091206, filed on Sep. 16, 2010, the entire contents of which are hereby incorporated by reference.

BACKGROUND OF THE INVENTION

The present invention disclosed herein relates to an electric device, and more particularly, to an energy harvesting electric device.

Recently, various kinds of electric devices have been introduced with development of electronics technology. For instance, demand for portable electric devices is increasing explosively with implementation of user-oriented ubiquitous computing. The portable electric devices may include a portable power source such as a battery. However, the power supply using the battery is limited because the battery is used once or needed to be periodically charged. Therefore, energy harvesting is needed for the electric devices.

The energy harvesting is a technology for converting wasted mechanical energy such as vibrations of trains, vacuum pumps, car engines, or human beings into electric energy. An energy harvester may include a piezoelectric device which is a kind of transducer.

SUMMARY OF THE INVENTION

The present invention provides a small-sized energy harvesting electric device.

The present invention also provides a high-output energy harvesting electric device.

Embodiments of the present invention provide energy harvesting electric devices including an energy harvester array including a plurality of energy harvesters, a single rectifier connected to the energy harvester array, and an output unit which is connected to the single rectifier and has a load resistance, wherein the energy harvesters include a plurality of first energy harvesters connected to each other in parallel and a single second energy harvester connected in parallel to the first energy harvesters, wherein the first energy harvesters have a first specific resistance higher than the load resistance and the second energy harvester has a second specific resistance higher than the first specific resistance.

In some embodiments, the first energy harvesters may include parallel-type piezoelectric bimorphs and the second energy harvester may include a serial-type piezoelectric bimorph. A specific resistance of the parallel-type piezoelectric bimorph may be lower than that of the serial-type piezoelectric bimorph. The serial-type piezoelectric bimorph may make a whole effective resistance of the harvester array approximate to the load resistance.

In other embodiments, the serial-type piezoelectric bimorph and the parallel-type piezoelectric bimorphs may include a plurality of piezoelectric single-crystalline plates having the same magnitude of polarization.

In still other embodiments, polarizations of the piezoelectric single-crystalline plates may be connected in series in the serial-type piezoelectric bimorph. Herein, the serial connection may include sequentially arranging the polarizations of the piezoelectric single-crystalline plates in the same direction.

In even other embodiments, polarizations of the piezoelectric single-crystalline plates may be connected in parallel in the parallel-type piezoelectric bimorph. The parallel connection may include arranging the polarizations of the piezoelectric single-crystalline plates abreast.

In yet other embodiments, the piezoelectric single-crystalline plates may have the same size.

In further embodiments, the piezoelectric single-crystalline plates may include one of materials of PMN-PT, PZN-PT, and PMN-PZT.

In still further embodiments, each of the parallel-type piezoelectric bimorphs may include a shim between the piezoelectric single-crystalline plates each other, and a plurality of electrodes on and under the piezoelectric single-crystalline plates.

In even further embodiments, the electrodes may include an interdigital electrode.

In yet further embodiments, the first energy harvesters may include a first piezoelectric unimorph and the second energy harvester may include a second piezoelectric unimorph.

In much further embodiments, the first piezoelectric unimorph may include a first piezoelectric single-crystalline plate and the second piezoelectric unimorph may include a second piezoelectric single-crystalline plate which is smaller than the first piezoelectric unimorph or is clopped with smaller amount of impurities than the first piezoelectric unimorph.

In still much further embodiments, a stabilizer may be further included between the output unit and the rectifier.

In even much further embodiments, a synchronized switching unit may be further included between the energy harvester array and the rectifier.

In yet much further embodiments, the synchronized switching unit may include an inductor and a switch.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
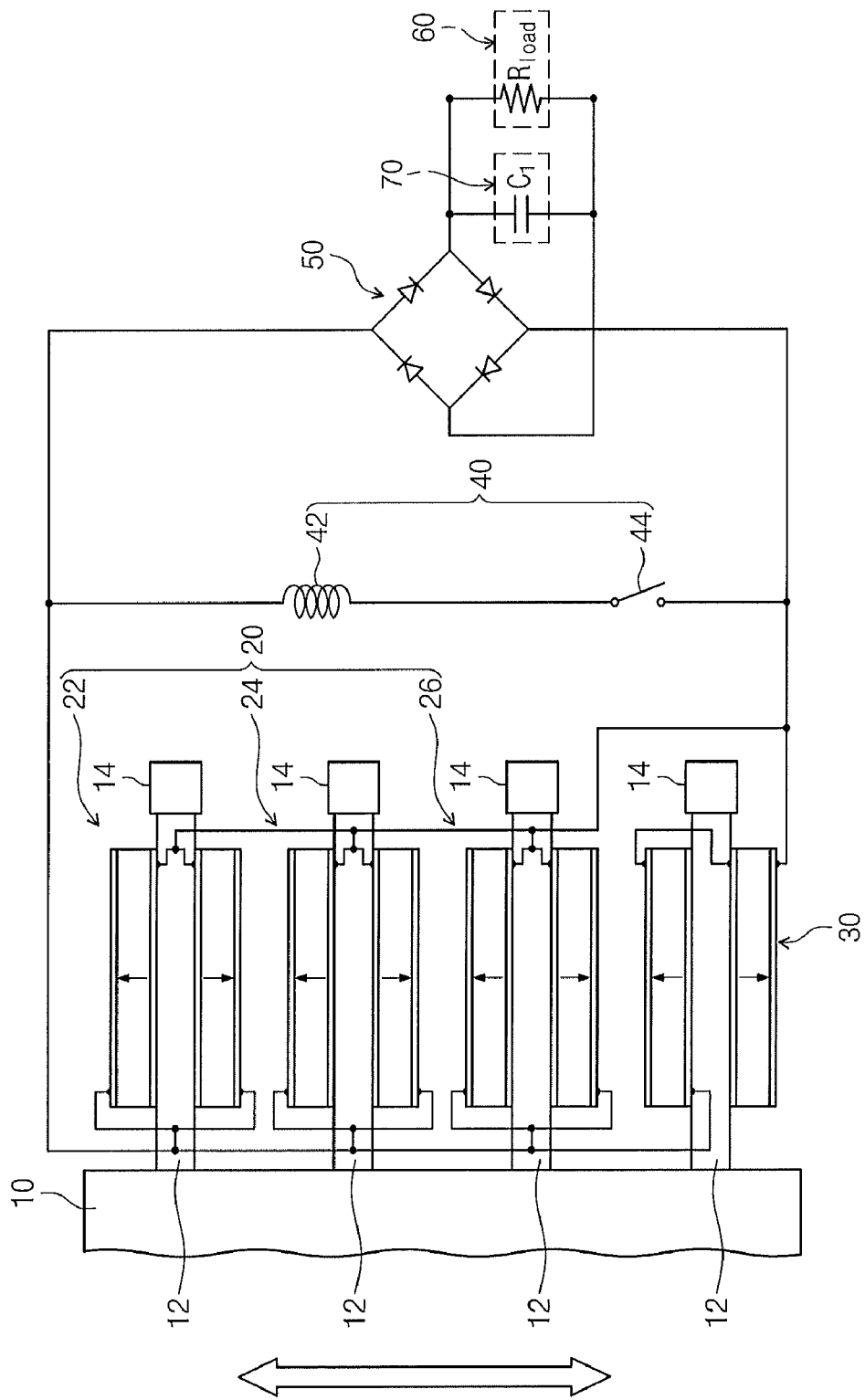
FIG. 1 is a diagram illustrating an energy harvesting electric device according to an embodiment of the present invention.

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Like reference numerals refer to like elements throughout.

The terms used in this disclosure are not for limiting the inventive concept but for explaining the embodiments. The terms of a singular form may include plural forms unless otherwise specified. Also, the meaning of "include," "comprise," "including," or "comprising," specifies a property, a region, a fixed number, a step, a process, an element and/or a component but does not exclude other properties, regions, fixed numbers, steps, processes, elements and/or components. The reference numerals presented according to a sequence of explanations are not limited to the sequence.

Figure 2:
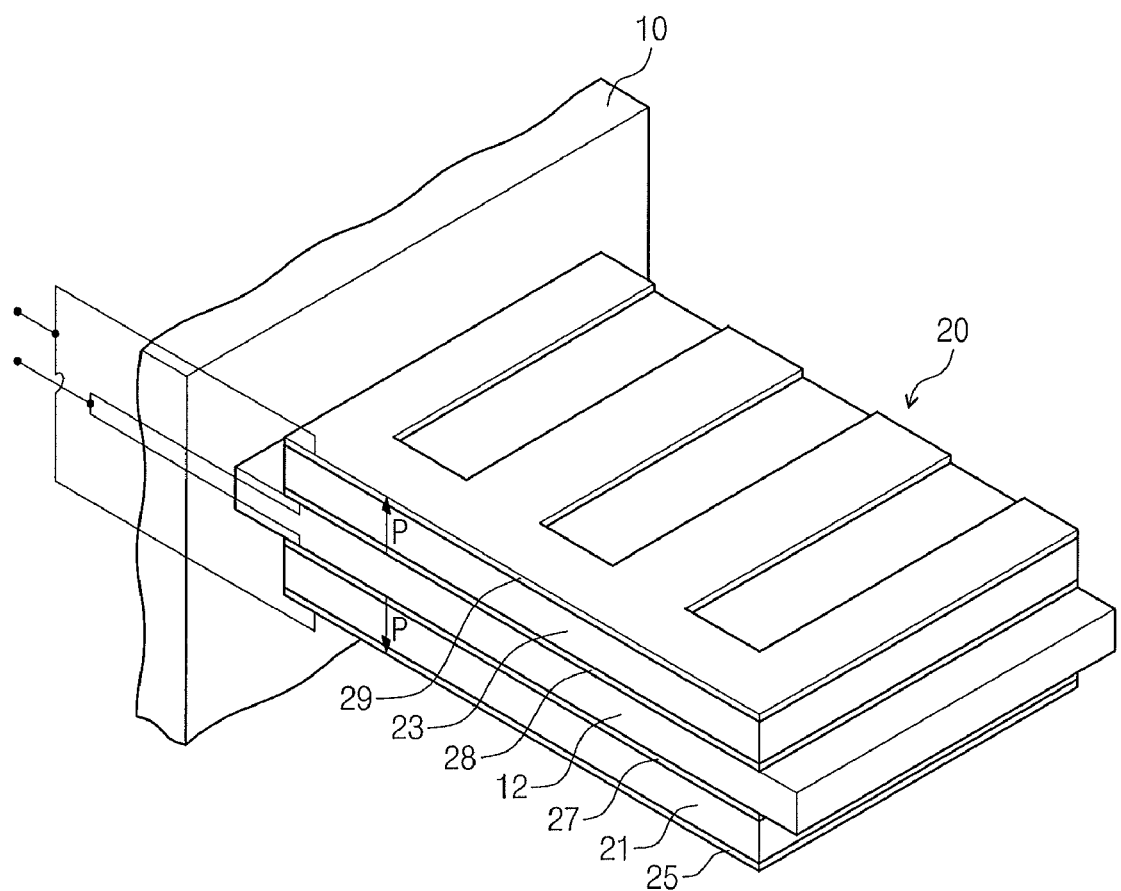
FIG. 2 is a diagram illustrating a parallel-type piezoelectric bimorph of FIG. 1.
Figure 3:
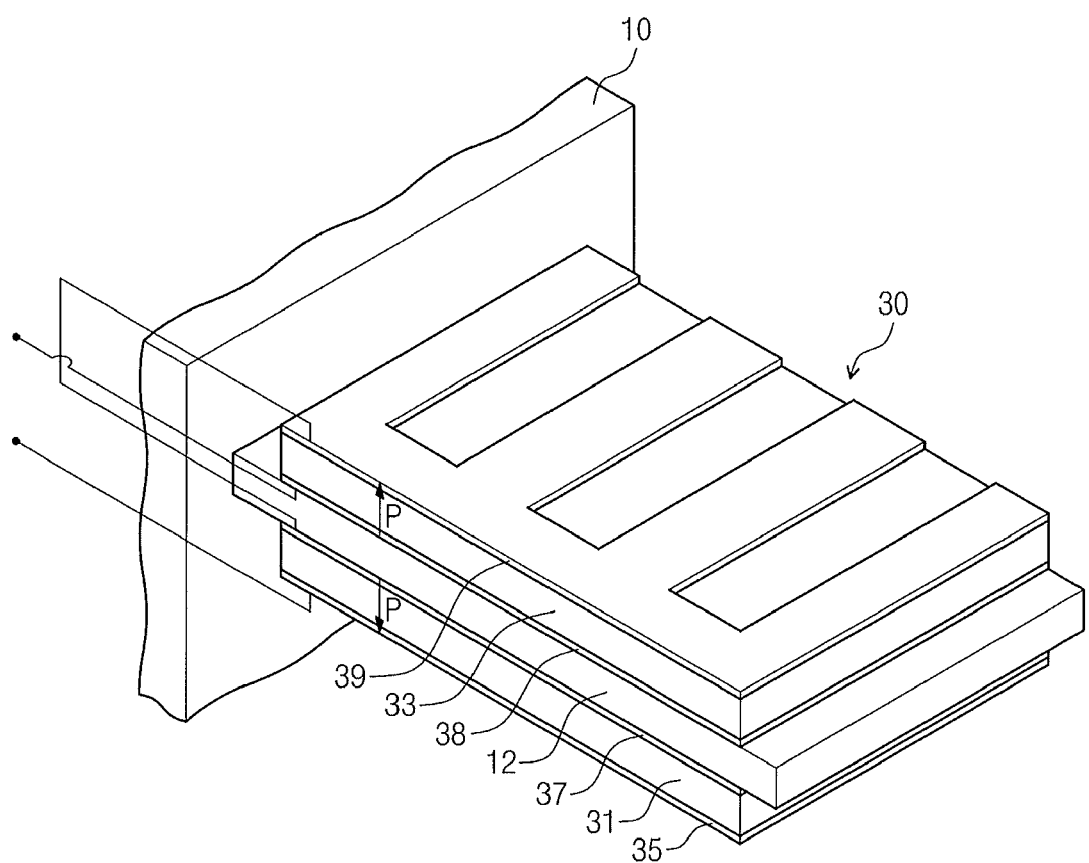
FIG. 3 is a diagram illustrating a serial-type piezoelectric bimorph of FIG. 1.

FIG. 1 is a diagram illustrating an energy harvesting electric device according to an embodiment of the present invention. FIG. 2 is a diagram illustrating a parallel-type piezoelectric bimorph 20 of FIG. 1. FIG. 3 is a diagram illustrating a serial-type piezoelectric bimorph 30 of FIG. 1.

Referring to FIGS. 1 to 3, the energy harvesting electric device according to the embodiment of the present invention may include a plurality of parallel-type piezoelectric bimorphs 20 connected to each other in parallel and the serial-type piezoelectric bimorph 30 connected to the plurality of parallel-type piezoelectric bimorphs 20 in parallel. When an effective resistance of the parallel-type piezoelectric bimorphs 20 and the serial-type piezoelectric bimorph 30 match a load resistance $R_{load}$ of an output unit 60, an output power may be maximized. The load resistance $R_{load}$ of the output unit 60 may be lower than each specific resistance of the parallel-type piezoelectric bimorphs 20 and the serial-type piezoelectric bimorph 30. The parallel-type piezoelectric bimorphs 20 connected to each other in parallel may have a lower effective resistance than the load resistance $R_{load}$ of the output unit 60. As the number of the parallel-type piezoelectric bimorphs 20 is increased, the effective resistance may be decreased. The serial-type piezoelectric bimorph 30 may match the effective resistance of the parallel-type piezoelectric bimorphs 20 to the load resistance $R_{load}$ of the output unit 60.

Therefore, the energy harvesting electric device according to the embodiment of the present invention may maximize the output power.

The serial-type piezoelectric bimorph 30 and the parallel-type piezoelectric bimorphs 20 may be structured as an energy harvester array connected in parallel to an energy source 10. The parallel-type piezoelectric bimorphs 20 may include first to third parallel-type piezoelectric bimorphs 22, 24, and 26. The first to third parallel-type piezoelectric bimorphs 22, 24, and 26 may be connected to each other in parallel. As the number of the parallel-type piezoelectric bimorphs 20 is increased, the effective resistance may be gradually decreased and an output current may be increased. In the case that a phase difference of the output voltage is not generated, the parallel-type piezoelectric bimorphs 20 may be connected to one rectifier 50. The rectifier 50 may include a bridge rectifier having 2 or 4 diodes.

The first to third parallel-type piezoelectric bimorphs 22, 24, and 26 may be connected to a sidewall of one energy source 10. The first to third parallel-type piezoelectric bimorphs 22, 24, and 26 may have a first specific resistance higher than the load resistance $R_{load}$ of the output unit 60. Each of the parallel-type piezoelectric bimorphs 20 may include a shim 12, a weight 14, first and second piezoelectric single-crystalline plates 21 and 23, and first to fourth electrodes 25 and 27 to 29. The shim 12 is connected to the energy source 10. The weight 14 is formed at a free end of the shim 12 opposing the energy source 10. The first and second piezoelectric single-crystalline plates 21 and 23 are formed on and under the shim 12 between the weight 14 and the energy source 10. The first to fourth electrodes 25 and 27 to 29 are formed on and under each of the first and second piezoelectric single-crystalline plates 21 and 23.

The first and second piezoelectric single-crystalline plates 21 and 23 may include materials having the same magnitude of polarization P. For instance, the first and second piezoelectric single-crystalline plates 21 and 23 may include one of materials of PMN-PT, PZN-PT, and PMN-PZT. The first and second piezoelectric single-crystalline plates 21 and 23 may have polarizations P opposite to each other with respect to the shim 12. The first piezoelectric single-crystalline plate 21 may have a polarization P toward a lower part of the shim 12. The second piezoelectric single-crystalline plate 23 may have a polarization P toward an upper part of the shim 12. The first and second piezoelectric single-crystalline plates 21 and 23 may be connected to each other in parallel. Herein, the parallel connection may be defined as arranging a plurality of polarizations P abreast.

The first and second electrodes 25 and 27 may be arranged on and under the first piezoelectric single-crystalline plate 21. The first and second electrodes 25 and 27 may include interdigital electrodes in the shape of crossed hooks on and under the first piezoelectric single-crystalline plate 21. The third and fourth electrodes 28 and 29 may be arranged on and under the second piezoelectric single-crystalline plate 23. The third and fourth electrodes 28 and 29 may include interdigital electrodes.

The first electrode 25 may be connected to the fourth electrode 29, and the second electrode 27 may be connected to the third electrode 28. The parallel-type piezoelectric bimorphs 20 may have a lower effective resistance than each specific resistance of the first and second single-crystalline plates 21 and 23.

The first specific resistance of each of the parallel-type piezoelectric bimorphs 20 may be proportional to a resonant frequency of the energy source 10 and each effective capacitance of the first and second piezoelectric single-crystalline plates 21 and 23. Herein, the resonant frequency may include an oscillation frequency of the energy source 10 measured by a short-circuit (for example, 50 Ohm resistor, or electrical wires is connected) to which the energy harvester array is connected in parallel. Also, the first specific resistance may be proportional to a mechanical damping ratio, an electrical-mechanical coupling coefficient, and a function of the resonant frequency or effective piezoelectric capacitance.

In the case that the parallel-type piezoelectric bimorphs 20 are connected to each other in parallel, the effective resistance may be lower than the first specific resistance. The effective resistance of the parallel-type piezoelectric bimorphs 20 connected to each other in parallel may be reduced to one-third of each first specific resistance of the first to third parallel-type piezoelectric bimorphs 22, 24, and 26. In the case that the parallel-type piezoelectric bimorphs 20 are connected to each other in parallel, the effective resistance is decreased, and thus, the current may be maximized. Herein, when the current intensity in the piezoelectric harvester array connected in parallel is high and the whole effective resistance of the piezoelectric harvester array is the same as the load resistance $R_{load}$ of the output unit 60, the output power may be maximized.

The serial-type piezoelectric bimorph 30 may be connected in parallel to the parallel-type piezoelectric bimorphs 20 and may make the whole effective resistance of the energy harvester array approximate to the load resistance $R_{load}$. The serial-type piezoelectric bimorph 30 may have a second specific resistance higher than the first specific resistance.

The serial-type piezoelectric bimorph 30 may include a shim 12, a weight 14, third and fourth piezoelectric single-crystalline plates 31 and 33, and fifth to eighth electrodes 35 and 37 to 39. The shim 12 is connected to the energy source 10. The weight 14 is formed at a terminal of the shim 12 opposing the energy source 10. The third and fourth piezoelectric single-crystalline plates 31 and 33 are formed on and under the shim 12 between the weight 14 and the energy source 10. The fifth to eighth electrodes 35 and 37 to 39 are formed on and under each of the third and fourth piezoelectric single-crystalline plates 31 and 33.

The third and fourth piezoelectric single-crystalline plates 31 and 33 may have the same sizes and polarizations P as those of the first and second piezoelectric single-crystalline plates 21 and 23 respectively. The third and fourth piezoelectric single-crystalline plates 31 and 33 may have polarizations P opposite to each other with respect to the shim 12. The third and fourth piezoelectric single-crystalline plates 31 and 33 may be connected to each other in series. Herein, the serial connection may be defined as continuously or sequentially arranging a plurality of polarizations P which has the same direction.

The fifth and sixth electrodes 35 and 37 may be arranged on and under the third piezoelectric single-crystalline plate 31. The fifth and sixth electrodes 35 and 37 may include interdigital electrodes. The seventh and eighth electrodes 38 and 39 may be arranged on and under the fourth piezoelectric single-crystalline plate 33. The seventh and eighth electrodes 38 and 39 may include interdigital electrodes. The sixth electrode 37 may be connected to the eighth electrode 39, and the fifth electrode 35 may be separated from the seventh electrode 38. The fifth electrode 35 and the seventh electrode 38 may be connected to the parallel-type piezoelectric bimorphs 20. The serial-type piezoelectric bimorph 30 may have a higher effective resistance than each second specific resistance of the third and fourth piezoelectric single-crystalline plates 31 and 33.

The serial-type piezoelectric bimorph 30 may be connected in parallel to the parallel-type piezoelectric bimorphs 20. The fifth electrode 53 and the seventh electrode 38 may be connected in parallel to the parallel-type piezoelectric bimorphs 20.

The output unit 60 may have the load resistance $R_{load}$ of the serial-type piezoelectric bimorph 30 and the parallel-type piezoelectric bimorphs 20. For instance, the output unit 60 may include a battery and an output circuit (not illustrated) for charging the battery. A stabilizer 70 may be arranged between the output unit 60 and the rectifier 70. The stabilizer 70 may eliminate a noise of the output power outputted from the output unit 60. For instance, the stabilizer 70 may include a capacitor $C_1$.

A switching unit 40 synchronized with the parallel-type piezoelectric bimorphs 20, the serial-type piezoelectric bimorph 30, and the rectifier 50 may be included. The synchronized switching unit 40 may include an inductor 42 and a switch 44. The switch 44 may be switched in synchronization with the resonant frequency of the energy source 10. The inductor 42 may prevent a rapid change of current according to the switching operation of the switch 44. The inductor 42 may generate a voltage which lags behind the current change by about $\pi/2$. The inductor 42 may increase the output power according to the switching operation of the switch 44. For instance, in the case that the inductor 42 is switched at a maximum or minimum value of an oscillation range of the piezoelectric energy harvester array, the output power may be inversed. The inversed output power may be amplified due to a loss caused by a resistor. Accordingly, the output power may be increased. The amplification value of the output power depends on the load resistance $R_{load}$, piezoelectric capacitance, and resonant frequency. (Reference: Daniel Guyomar, et al, "Toward Energy Harvesting Using Active Materials and Conversion Improvement by Nonlinear Processing", IEEE transactions on ultrasonics, ferroelectrics, and frequency control, Vol. 52. No. 4, pp. 584-595, April 2005)

When the parallel-type piezoelectric bimorphs 20 having the first specific resistance higher than the load resistance $R_{load}$ are connected in parallel, one serial-type piezoelectric bimorph 30 having the second specific resistance higher than the first specific resistance may make the whole effective resistance approximate to the load resistance $R_{load}$. Therefore, the energy harvesting electric device according to the embodiment of the present invention may maximize the output power.

Figure 4:
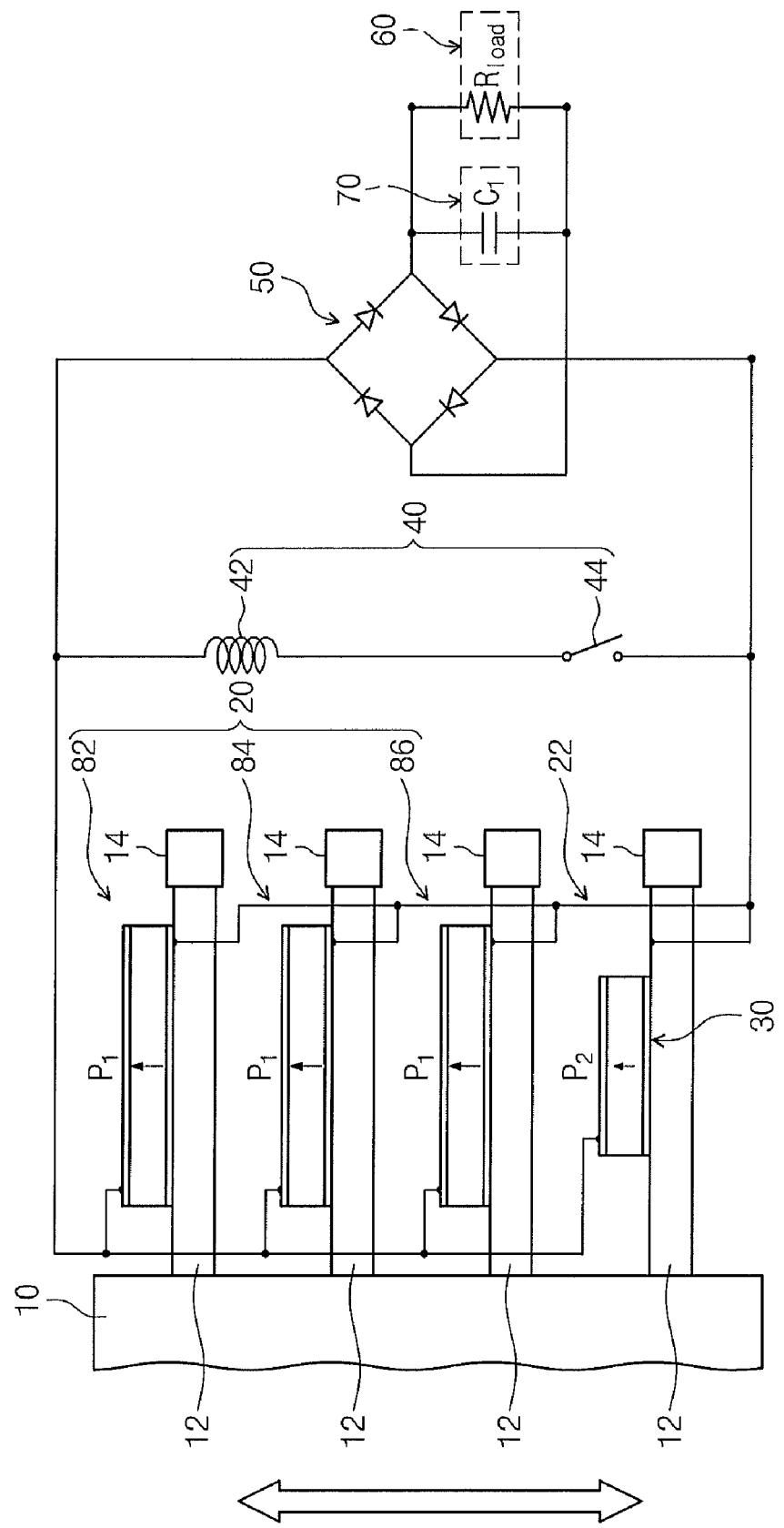
FIG. 4 is a diagram illustrating an energy harvesting electric device according to another embodiment of the present invention.
Figure 5:
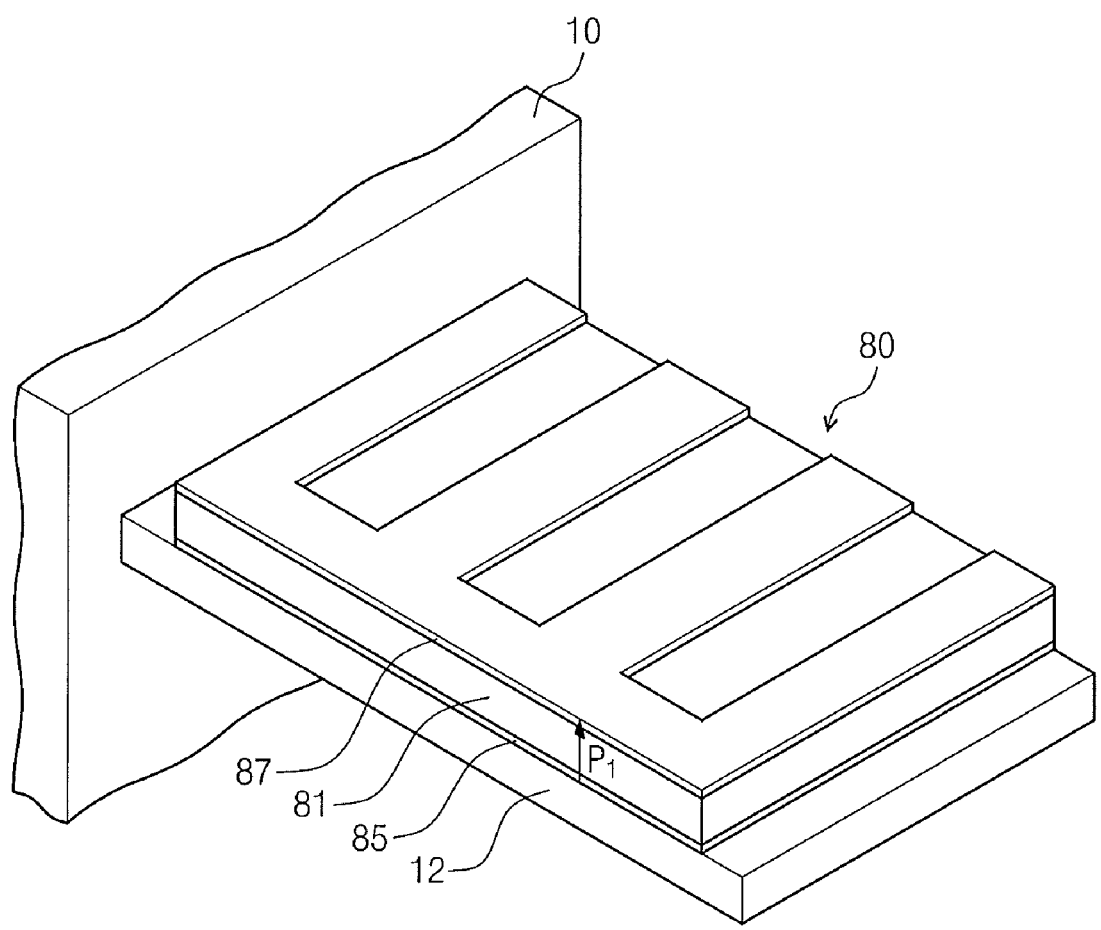
FIG. 5 is a diagram illustrating low-resistance piezoelectric unimorphs of FIG. 4.
Figure 6:
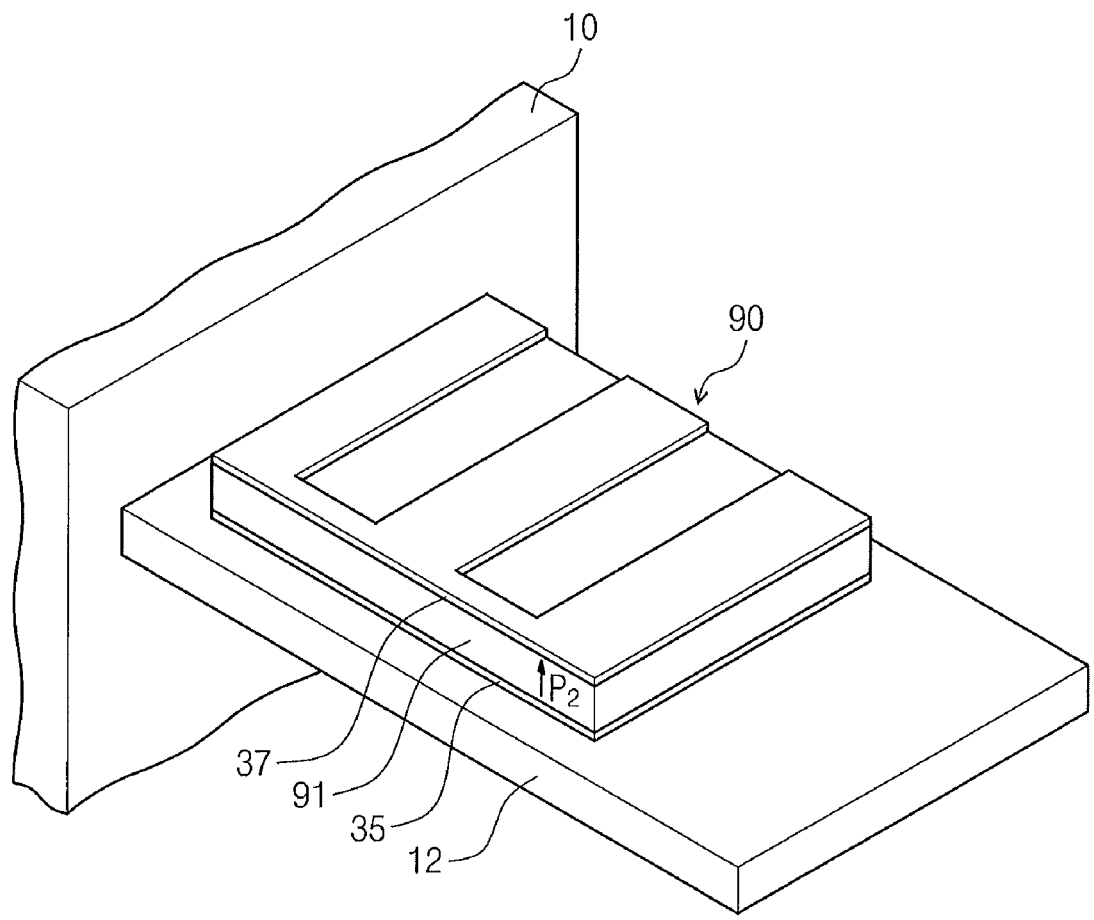
FIG. 6 is a diagram illustrating a high-resistance piezoelectric unimorph of FIG. 4.

FIG. 4 is a diagram illustrating an energy harvesting electric device according to another embodiment of the present invention. FIG. 5 is a diagram illustrating low-resistance piezoelectric unimorphs 80 of FIG. 4. FIG. 6 is a diagram illustrating a high-resistance piezoelectric unimorph 90 of FIG. 4. Herein, in the other embodiment of the present invention, respective components may be referred to as the same or different numerals in comparison with the embodiment of FIG. 1.

Referring to FIGS. 4 to 6, the energy harvesting electric device according to the other embodiment of the present invention may include a plurality of low-resistance piezoelectric unimorphs 80 connected to each other in parallel and the high-resistance piezoelectric unimorph 90 connected in parallel to the plurality of low-resistance piezoelectric unimorphs 80.

The output power may be maximized when an effective resistance of the low-resistance piezoelectric unimorphs 80 and the high-resistance piezoelectric unimorph 90 matches the load resistance $R_{load}$ of the output unit 60. The load resistance $R_{load}$ of the output unit 60 may be lower than each specific resistance of the low-resistance piezoelectric unimorphs 80 and the high-resistance piezoelectric unimorph 90. The low-resistance piezoelectric unimorphs 80 connected to each other in parallel may have a lower effective resistance than the load resistance $R_{load}$ of the output unit 60. As the number of the low-resistance piezoelectric unimorphs 80 is increased, the effective resistance may be decreased. The high-resistance piezoelectric unimorph 90 may make the effective resistance of the low-resistance piezoelectric unimorphs 80 connected to each other in parallel approximate to the load resistance $R_{load}$ of the output unit 60.

Therefore, the energy harvesting electric device according to the other embodiment of the present invention may maximize the output power.

The high-resistance piezoelectric unimorph 90 and the low-resistance piezoelectric unimorphs 80 may be structured as an energy harvester array connected in parallel to the energy source 10. The low-resistance piezoelectric unimorphs 80 may include first to third low-resistance piezoelectric unimorphs 82, 84, and 86. The first to third low-resistance piezoelectric unimorphs 82, 84, and 86 may be connected to each other in parallel. As the number of the low-resistance piezoelectric unimorphs 80 is increased, the effective resistance may be gradually decreased and the output current may be increased. In the case that the phase difference of the output voltage is not generated, the low-resistance piezoelectric unimorphs 80 may be connected to one rectifier 50. The rectifier 50 may include a bridge rectifier having 2 or 4 diodes.

The first to third low-resistance piezoelectric unimorphs 82, 84, and 86 may be connected to a sidewall of one energy source 10. The first to third low-resistance piezoelectric unimorphs 82, 84, and 86 may have a first specific resistance higher than the load resistance $R_{load}$ of the output unit 60. Each of the low-resistance piezoelectric unimorphs 80 may include a shim 12, a weight 14, a low-resistance piezoelectric single-crystalline plate 81, and first and second electrodes 85 and 87. The shim 12 is connected to the energy source 10. The weight 14 is formed at a terminal of the shim 12 opposing the energy source 10. The low-resistance piezoelectric single-crystalline plate 81 is formed on the shim 12 between the weight 14 and the energy source 10. The first and second electrodes 85 and 87 are formed on and under the low-resistance piezoelectric single-crystalline plate 81.

The low-resistance piezoelectric single-crystalline plate 81 may include one of materials of PMN-PT, PZN-PT, and PMN-PZT. The low-resistance piezoelectric single-crystalline plate 81 may have a first polarization P1. The first and second electrodes 85 and 87 may include interdigital electrodes in the shape of crossed hooks on and under the low-resistance piezoelectric single-crystalline plate 81.

The first specific resistance of each of the low-resistance piezoelectric unimorphs 80 may be proportional to a resonant frequency of the energy source 10 and the effective capacitance of the low-resistance piezoelectric single-crystalline plate 81. Herein, the resonant frequency may include an oscillation frequency of the energy source 10. Also, the first specific resistance may be proportional to a mechanical damping ratio, an electrical-mechanical coupling coefficient, and a function of the resonant frequency or effective piezoelectric capacitance.

In the case that the low-resistance piezoelectric unimorphs 80 are connected to each other in parallel, the effective resistance may be lower than the first specific resistance. The effective resistance of the low-resistance piezoelectric unimorphs 80 connected to each other in parallel may be reduced to one-third of each first specific resistance of the first to third low-resistance piezoelectric unimorphs 82, 84, and 86. In the case that the low-resistance piezoelectric unimorphs 80 are connected to each other in parallel, the effective resistance is decreased, and thus, the current may be maximized. When the current intensity in the piezoelectric harvester array connected in parallel is high and the whole effective resistance of the piezoelectric harvester array is the same as the load resistance $R_{load}$, the output power may be maximized.

The high-resistance piezoelectric unimorph 90 may be connected in parallel to the low-resistance piezoelectric unimorphs 80 and may make the whole effective resistance of the energy harvester array approximate to the load resistance $R_{load}$. The high-resistance piezoelectric unimorph 90 may have a second specific resistance higher than the first specific resistance.

The high-resistance piezoelectric unimorph 90 may include a shim 12, a weight 14, a high-resistance piezoelectric single-crystalline plate 91, and third and fourth electrodes 95 and 97. The shim 12 is connected to the energy source 10. The weight 14 is formed at a terminal of the shim 12 opposing the energy source 10. The high-resistance piezoelectric single-crystalline plate 91 is formed on the shim 12 between the weight 14 and the energy source 10. The third and fourth electrodes 95 and 97 are formed on and under the high-resistance piezoelectric single-crystalline plate 91.

The high-resistance piezoelectric single-crystalline plate 91 may have a second polarization P2 smaller than that of the low-resistance piezoelectric single-crystalline plate 81. The high-resistance piezoelectric single-crystalline plate 91 may have a smaller size or may be clopped with small amount of impurities in comparison with the low-resistance piezoelectric single-crystalline plate 81. Therefore, the energy harvesting electric device according to the other embodiment of the present invention may be microminiaturized because the size of the high-resistance piezoelectric single-crystalline plate 91 is reduced in the energy harvester array connected in parallel.

The third and fourth electrodes 95 and 97 may include interdigital electrodes. The third electrode may be connected to the first electrode 85, and the fourth electrode 97 may be connected to the second electrode 87. Therefore, the high-resistance piezoelectric unimorph 90 may be connected in parallel to the low-resistance piezoelectric unimorphs 80. Herein, the parallel connection may be defined as connecting the first polarization P1 of the low-resistance piezoelectric unimorphs 80 to the second polarization P2 of the high-resistance piezoelectric unimorph 90 abreast.

As a result, the energy harvesting electric device according to the other embodiment of the present invention may be microminiaturized and may maximize the output power adding the small-sized high-resistance piezoelectric unimorph 90 in the energy harvester array.

As described above, according to the embodiments of the present invention, one energy harvester of the energy harvester array connected in parallel may be a high-resistance energy harvester. The high-resistance energy harvester can make the effective resistance of the energy harvester array approximate to the load resistance of the output power. Therefore, the energy harvesting electric device can maximize the output power.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An energy harvesting electric device, comprising:
an energy harvester array comprising a plurality of energy harvesters;
a single rectifier connected to the energy harvester array; and
an output unit which is connected to the single rectifier and has a load resistance, wherein the energy harvesters comprise a plurality of first energy harvesters connected to each other in parallel and a single second energy harvester connected in parallel to the first energy harvesters, wherein the first energy harvesters have a first specific resistance higher than the load resistance and the second energy harvester has a second specific resistance higher than the first specific resistance.

2. The energy harvesting electric device of claim 1, wherein the first energy harvesters comprise parallel-type piezoelectric bimorphs and the second energy harvester comprises a serial-type piezoelectric bimorph.

3. The energy harvesting electric device of claim 2, wherein the serial-type piezoelectric bimorph and the parallel-type piezoelectric bimorphs comprise a plurality of piezoelectric single-crystalline plates having the same magnitude of polarization.

4. The energy harvesting electric device of claim 3, wherein polarizations of the piezoelectric single-crystalline plates are connected in parallel in the parallel-type piezoelectric bimorph.

5. The energy harvesting electric device of claim 3, wherein polarizations of the piezoelectric single-crystalline plates are connected in series in the serial-type piezoelectric bimorph.

6. The energy harvesting electric device of claim 3, wherein the piezoelectric single-crystalline plates have the same size.

7. The energy harvesting electric device of claim 3, wherein the piezoelectric single-crystalline plates comprise one of materials of PMN-PT, PZN-PT, and PMN-PZT.

8. The energy harvesting electric device of claim 3, wherein each of the parallel-type piezoelectric bimorphs comprises a shim between the piezoelectric single-crystalline plates, and a plurality of electrodes on and under the piezoelectric single-crystalline plates.

9. The energy harvesting electric device of claim 8, wherein the electrodes comprise an interdigital electrode.

10. The energy harvesting electric device of claim 1, wherein the first energy harvesters comprise a first piezoelectric unimorph and the second energy harvester comprises a second piezoelectric unimorph.

11. The energy harvesting electric device of claim 10, wherein the first piezoelectric unimorph comprises a first piezoelectric single-crystalline plate and the second piezoelectric unimorph comprises a second piezoelectric single-crystalline plate which is smaller than the first piezoelectric unimorph or is doped with smaller amount of impurities than the first piezoelectric unimorph.

12. The energy harvesting electric device of claim 1, further comprising a stabilizer between the output unit and the rectifier.

13. The energy harvesting electric device of claim 1, further comprising a synchronized switching unit between the energy harvester array and the rectifier.

14. The energy harvesting electric device of claim 13, wherein the synchronized switching unit comprises an inductor and a switch.

* * * * *